(12) United States Patent
Scott

(10) Patent No.: US 9,852,833 B1
(45) Date of Patent: Dec. 26, 2017

(54) MAGNETIZATION ALIGNMENT IN A THIN-FILM DEVICE

(71) Applicant: Alcatel-Lucent USA Inc., Murray Hill, NJ (US)

(72) Inventor: Gavin D. Scott, Hoboken, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 15/195,248

(22) Filed: Jun. 28, 2016

(51) Int. Cl.
*H01H 51/22* (2006.01)
*H01F 7/06* (2006.01)

(52) U.S. Cl.
CPC ...................................... *H01F 7/06* (2013.01)

(58) Field of Classification Search
CPC .... H01F 7/06; H01H 50/163; H01H 51/2272; H01H 1/0036; H01H 1/06
USPC ...... 335/78.296, 78, 80, 128, 131, 203, 251, 335/257, 261, 279
See application file for complete search history.

(56) References Cited

U.S. PATENT DOCUMENTS

2008/0134959 A1* 6/2008 Kasu ..................... C23C 16/274
117/84
2011/0254565 A1* 10/2011 De Boer ................ G01B 7/023
324/601

OTHER PUBLICATIONS

Ward, Daniel R., "Electrical and Optical Characterization of Molecular Nanojunctions," http://natelson.web.rice.edu/, 2010 [retrieved on May 4, 2016] Retrieved from the Internet: <URL: http://natelson.web.rice.edu/theses/ward_thesis.pdf> (155 pages).
Fursina, A., et al., "Nanogaps with Very Large Aspect Ratios for Electrical Measurements," Applied Physics Letters 92, 113102 (2008), American Institute of Physics, pp. 1-4.
Tang, J., et al., "Single-Molecule Transistor Fabrication by Self-Aligned Lithography and in Situ Molecular Assembly," Microelectronic Engineering, 83, (2006), pp. 1706-1709.

* cited by examiner

*Primary Examiner* — Bernard Rojas
(74) *Attorney, Agent, or Firm* — Mendelsohn Dunleavy, P.C.; Yuri Gruzdkov

(57) ABSTRACT

We disclose a magnetic device having a pair of coplanar thin-film magnetic electrodes arranged on a substrate with a relatively small edge-to-edge separation. In an example embodiment, the magnetic electrodes have a substantially identical footprint that can be approximated by an ellipse, with the short axes of the ellipses being collinear and the edge-to-edge separation between the ellipses being smaller than the size of the short axis. In some embodiments, the magnetic electrodes may have relatively small tapers that extend toward each other from the ellipse edges in the constriction area between the electrodes. Some embodiments may also include an active element inserted into the gap between the tapers and electrical leads connected to the magnetic electrodes for passing electrical current through the active element. When subjected to an appropriate external magnetic field, the magnetic electrodes can advantageously be magnetized to controllably enter parallel and antiparallel magnetization states.

21 Claims, 15 Drawing Sheets

100

100
BB

216

500

500

500

500

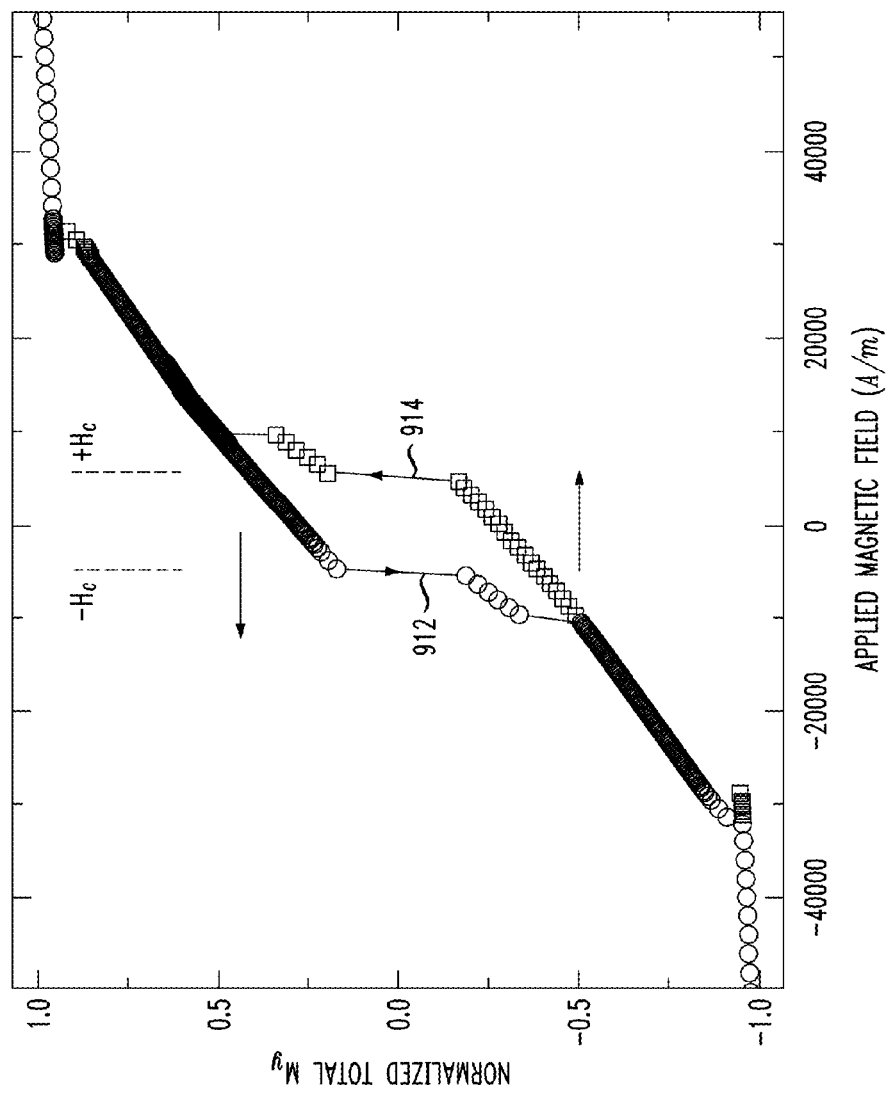

$H_{ext} \approx 0$ $H_{ext} \lesssim H_{sat}$

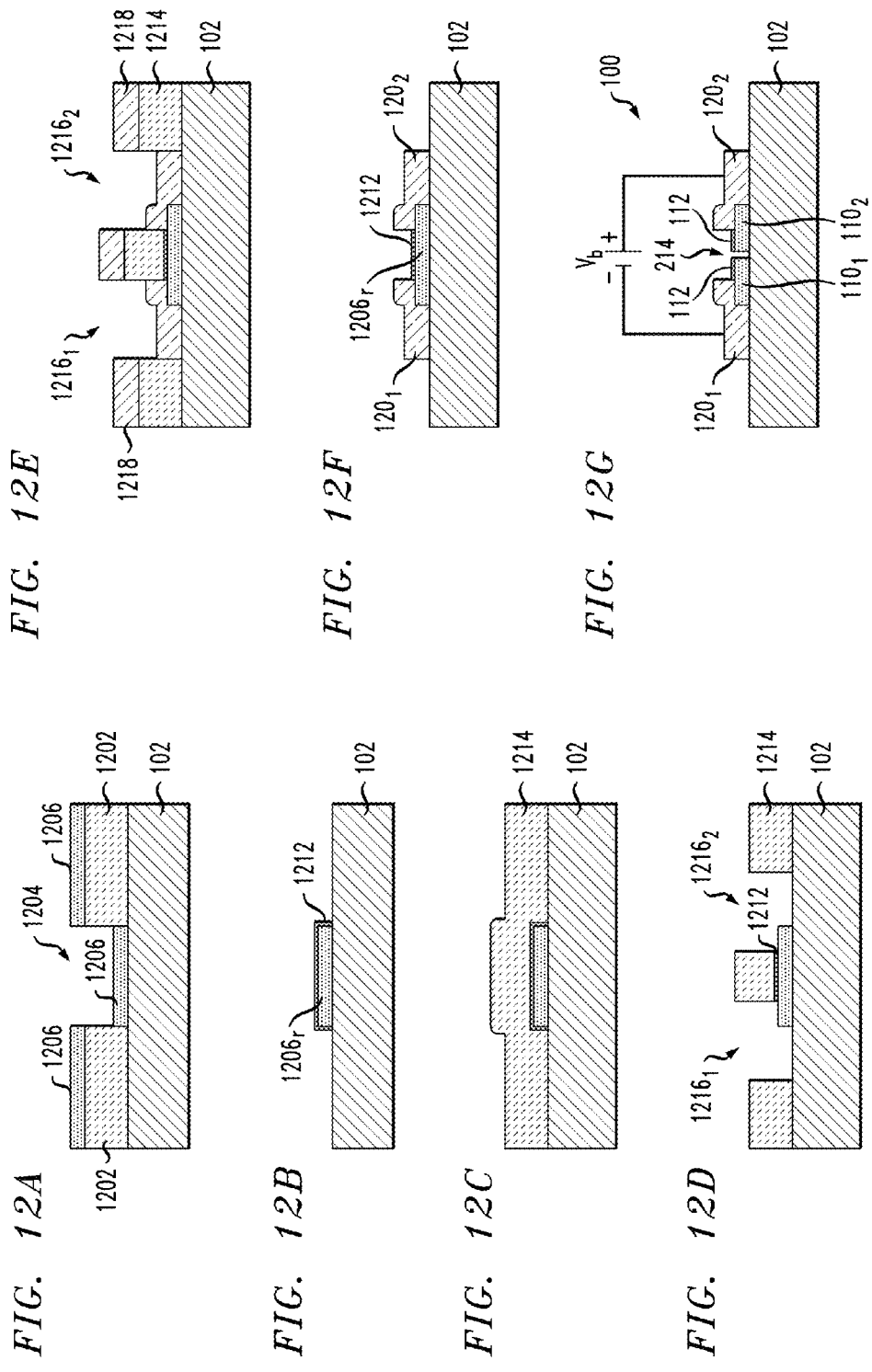

MAGNETIZATION ALIGNMENT IN A THIN-FILM DEVICE

BACKGROUND

Field

The present disclosure relates generally to spintronics and, more specifically but not exclusively, to methods and apparatus for controllably manipulating magnetization distribution(s) in thin-film devices.

Description of the Related Art

This section introduces aspects that may help facilitate a better understanding of the disclosure. Accordingly, the statements of this section are to be read in this light and are not to be understood as admissions about what is in the prior art or what is not in the prior art.

Some applications of thin-film magnetic devices rely on the ability to controllably generate the parallel and antiparallel magnetization alignment of two adjacent magnetic electrodes. More specifically, the parallel alignment corresponds to a situation in which the magnetization vectors of two adjacent magnetic electrodes are parallel to one another, i.e., pointing in the same direction or having the relative orientation angle of zero degrees. In contrast, the antiparallel alignment corresponds to a situation in which the magnetization vectors of two adjacent magnetic electrodes are antiparallel, i.e., pointing in the opposite directions or having the relative orientation angle of 180 degrees. While the parallel alignment can be generated in a relatively straightforward manner, the antiparallel alignment is significantly more difficult to generate, e.g., when the two magnetic electrodes have a nanometer-scale separation and/or are laterally adjacent to one another, rather than being stacked vertically.

SUMMARY OF SOME SPECIFIC EMBODIMENTS

Disclosed herein are various embodiments of a magnetic device having a pair of coplanar thin-film magnetic electrodes arranged on a substrate with a relatively small edge-to-edge separation. In an example embodiment, the magnetic electrodes have a substantially identical footprint that can be approximated by an ellipse, with the short axes of the ellipses being collinear and the edge-to-edge separation between the ellipses being smaller than the size of the short axis. In some embodiments, the magnetic electrodes may have relatively small tapers that extend toward each other from the ellipse edges in the constriction area between the electrodes. Some embodiments may also include an active element inserted into the gap between the tapers and electrical leads connected to the magnetic electrodes for passing electrical current through the active element. When subjected to an appropriate external magnetic field, the magnetic electrodes can advantageously be magnetized to controllably enter parallel and antiparallel magnetization states.

According to one embodiment, provided is an apparatus comprising, a substrate; and a first set of electrodes supported on the substrate, the set including a first thin-film magnetic electrode and a second thin-film magnetic electrode, each of the first and second thin-film magnetic electrodes having a substantially oval shape; wherein the substantially oval shape is characterized by a first axis having a first size and a second axis having a second size, the first and second axes being orthogonal to one another, and the second size being larger than the first size; wherein the first axis of the first thin-film magnetic electrode and the first axis of the second thin-film magnetic electrode are collinear; and wherein an edge-to-edge separation between the first thin-film magnetic electrode and the second thin-film magnetic electrode is smaller than the first size.

BRIEF DESCRIPTION OF THE DRAWINGS

Other aspects, features, and benefits of various disclosed embodiments will become more fully apparent, by way of example, from the following detailed description and the accompanying drawings, in which:

FIGS. 9A-9B graphically illustrate certain magnetic properties of the magnetic device of FIG. 1 according to an embodiment;

FIGS. 12A-12G illustrate a fabrication method that can be used to make the magnetic device of FIG. 1 according to an embodiment.

DETAILED DESCRIPTION

Figure 1A:
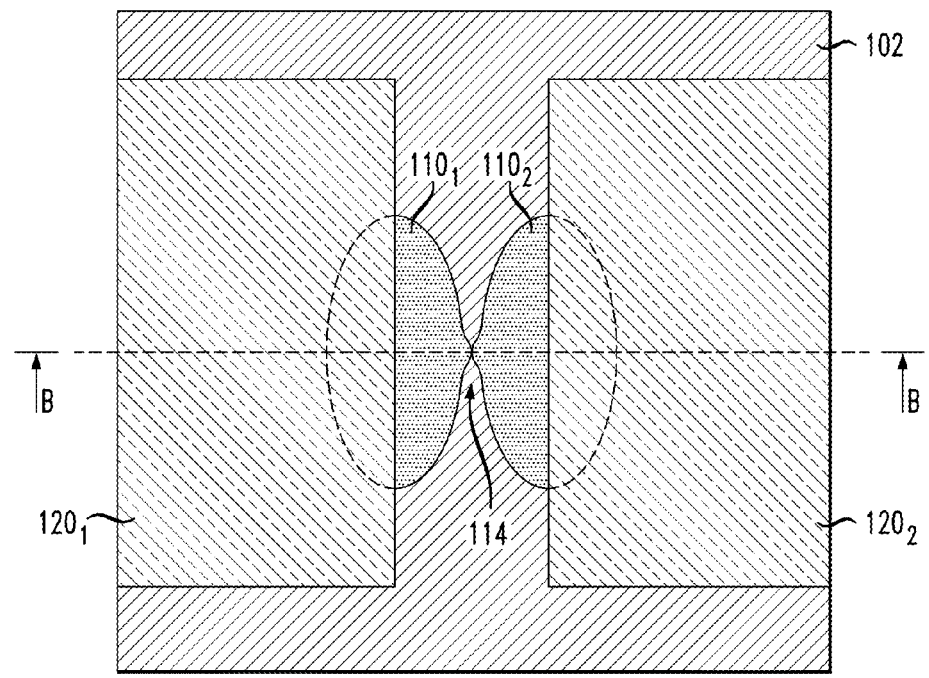
FIGS. 1A-1B illustrate top and cross-sectional side views of a magnetic device according to an embodiment.
Figure 1B:
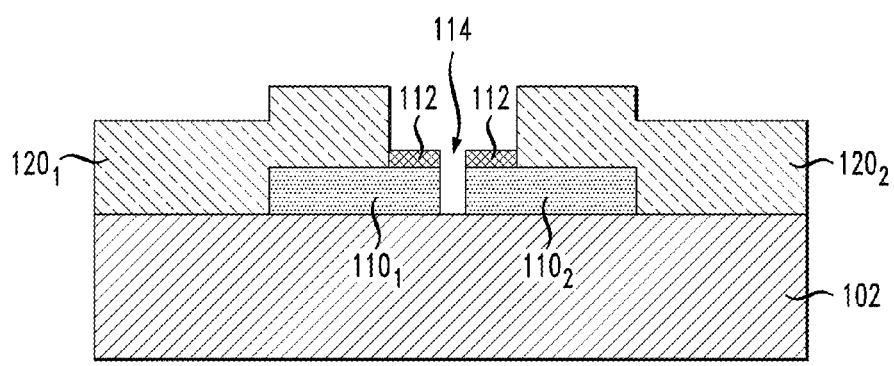

FIGS. 1A-1B illustrate top and cross-sectional side views, respectively, of a magnetic device 100 according to an embodiment. The dashed line in FIG. 1A indicates the position of the cross-section plane BB corresponding to FIG. 1B. An example fabrication process that can be used to make magnetic device 100 is described in more detail below in reference to FIG. 12. An example method of generating parallel and antiparallel alignment of magnetization vectors in magnetic device 100 is described in more detail below in reference to FIGS. 9-11.

Device 100 comprises a substrate 102 that supports a pair of thin-film magnetic electrodes $110_1$ and $110_2$. In some embodiments, device 100 further comprises a pair of (optional) non-magnetic, electrically conducting electrodes $120_1$ and $120_2$ that are configured to provide electrical leads to magnetic electrodes $110_1$ and $110_2$, respectively. Depending on the polarity of the voltage/current applied to electrically conducting electrodes $120_1$ and $120_2$, one of magnetic electrodes $110_1$-$110_2$ may be referred to as a "source" electrode, and the other electrode may be referred to as a "drain" electrode. Magnetic electrodes $110_1$ and $110_2$ are referred to herein as "thin-film" electrodes because the electrodes' lateral dimensions indicated in FIG. 1A are significantly larger than the electrodes' thickness or height indicated in FIG. 1B. In an example embodiment, the lateral dimensions of magnetic electrodes $110_1$ and $110_2$ can be in the range between about 100 nm and about 500 nm, whereas the electrodes' thickness can be smaller than about 10 nm.

The following materials can be used in some embodiments of device 100. Substrate 102 may comprise silicon and/or silicon oxide. Magnetic electrodes $110_1$ and $110_2$ may comprise a ferromagnetic or ferrimagnetic material. One example ferromagnetic material that can be used to make magnetic electrodes $110_1$ and $110_2$ is supermalloy, whose chemical composition can be described by the following chemical formula: $Ni_{80}Fe_{14}Mo_5X$, where X is another metal. Another example ferromagnetic material that can be used to make magnetic electrodes $110_1$ and $110_2$ is permalloy. Some ferromagnetic materials suitable for magnetic electrodes $110_1$ and $110_2$ may have a tendency to form native oxide layers, such as layers 112 shown in FIG. 1B, over electrode portions exposed to ambient air for a sufficiently long period of time. Non-magnetic electrically conducting electrodes $120_1$ and $120_2$ may comprise gold, titanium, and/or other electrically conducting materials suitable for creating ohmic contacts. Various adhesion layers (not explicitly shown in FIGS. 1A-1B) can be used as known in the pertinent art to ensure good structural adhesion between the shown parts of device 100.

A person of ordinary skill in the art will understand that other suitable materials can similarly be used in alternative embodiments of device 100.

In an example embodiment, each of magnetic electrodes $110_1$ and $110_2$ has a substantially oval shape. As used herein, the term "substantially" refers to possible relatively small deviations (if any) of the shape of a magnetic electrode 110 from a Cartesian oval shape, e.g., in the general area of a constriction 114 between magnetic electrodes $110_1$ and $110_2$. For example, the mass of an electrode 110 located outside of the footprint of the corresponding Cartesian oval shape near constriction 114 can be less than about 10% (or 5%, or 1%) of the total mass of that electrode.

In some embodiments, each of magnetic electrodes $110_1$ and $110_2$ can be approximately shaped as an ellipse, which is a special case of an oval. As known in the mathematical arts, an ellipse is a planar shape that has two orthogonal axes about which the ellipse is symmetric. These axes intersect at the center of the ellipse. The larger of the two axes is referred to as the major axis. The smaller of the two axes is referred to as the minor axis. The ratio of the sizes of the major and minor axes is referred to as the eccentricity of the ellipse.

In an example embodiment, each of the ellipses that can be used to approximate the shape of magnetic electrodes $110_1$ and $110_2$ can have the major and minor axes that are 200 nm and 100 nm, respectively. Alternative embodiments of magnetic electrodes $110_1$ and $110_2$ can be generated from this example embodiment using one or more of the following geometric modifications: (i) changing the eccentricity of the ellipses while having the size of one of the major/minor axes unchanged; (ii) uniformly scaling the ellipses by applying the same scaling factor to the major and minor axes; and (iii) changing the edge-to-edge separation, d, between the ellipses (also see FIG. 2A). The eccentricity can, for example, be in the range between about 1.5 and about 5. The scaling factor can, for example, be in the range between about 0.2 and about 5. The edge-to-edge separation d can, for example, be in the range between about 2 nm and about 100 nm.

Figure 2A:
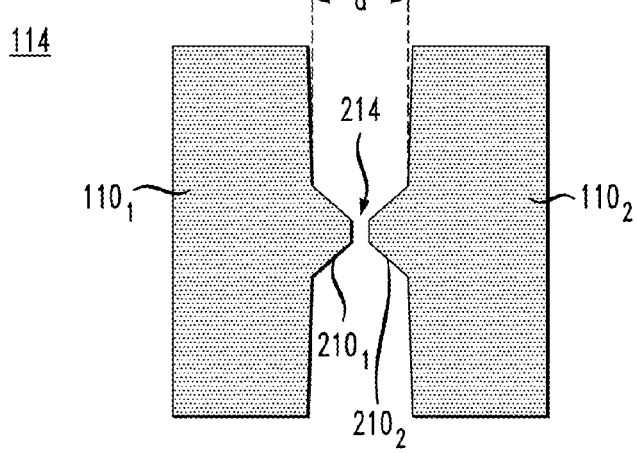
FIGS. 2A-2E show enlarged schematic top views of a constriction between two magnetic electrodes in the magnetic device of FIG. 1 according to example embodiments.

FIGS. 2A-2E show enlarged schematic views of constriction 114 between magnetic electrodes $110_1$ and $110_2$ in device 100 according to example embodiments. More specifically, the views shown in FIGS. 2A-2E are the top views of constriction 114 corresponding to FIG. 1A. FIG. 2A also pictorially illustrates the definition of the above-mentioned edge-to-edge separation d.

Referring to FIG. 2A, each of magnetic electrodes $110_1$ and $110_2$ comprises a respective one of trapezoid tapers $210_1$ and $210_2$, each of which extends from the edge of the corresponding oval or ellipse. In the shown embodiment, trapezoid tapers $210_1$ and $210_2$ are separated by a gap 214. In some alternative embodiments, gap 214 is not present, which causes tapers $210_1$ and $210_2$ to be connected to one another, thereby forming a physical bridge (not explicitly shown in FIG. 2A) between magnetic electrodes $110_1$ and $110_2$.

In various embodiments, the bases of the trapezoids corresponding to tapers $210_1$ and $210_2$ can have different respective sizes, e.g., each selected from a range between about 30 nm and 0 nm. Gap 214 can have a width that is smaller than about 5 nm or smaller than about 1 nm. Although FIG. 2A shows tapers $210_1$ and $210_2$ as having a shape of an isosceles trapezoid, other trapezoid shapes are also possible, including a rectangular shape.

Figure 2B:
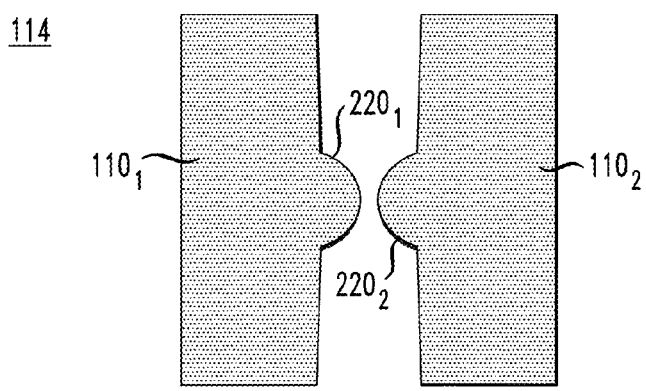

Referring to FIG. 2B, each of magnetic electrodes $110_1$ and $110_2$ comprises a respective one of convex tapers $220_1$ and $220_2$, each of which extends from the edge of the corresponding oval or ellipse. In some embodiments, the geometric shape of an outer edge of taper 220 can be approximated by a parabola or a semicircle.

Figure 2C:
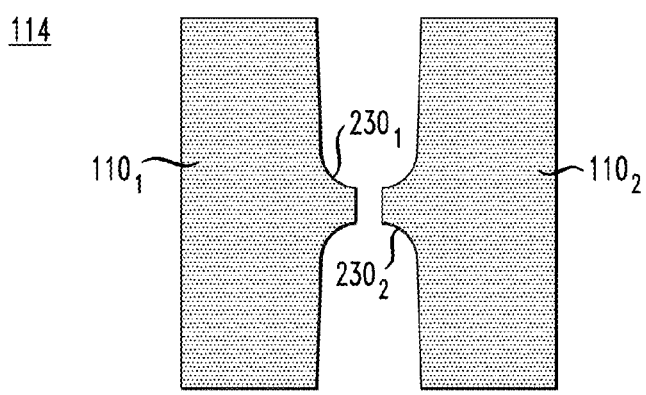

Referring to FIG. 2C, each of magnetic electrodes $110_1$ and $110_2$ comprises a respective one of concave or non-convex tapers $230_1$ and $230_2$, each of which extends from the edge of the corresponding oval or ellipse. In some embodiments, the geometric shape of some of the outer edges of taper 230 can be approximated by a hyperbola or an exponent.

Figure 2D:
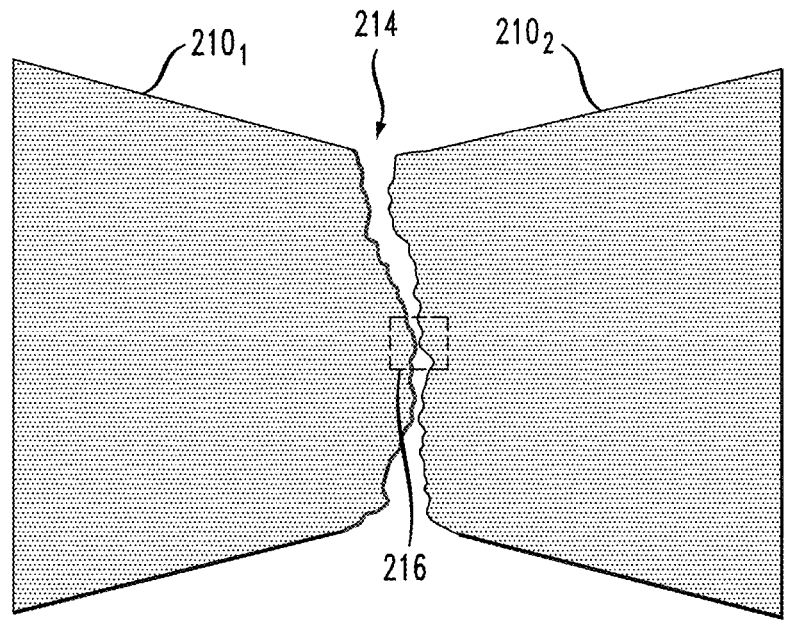
Figure 2E:
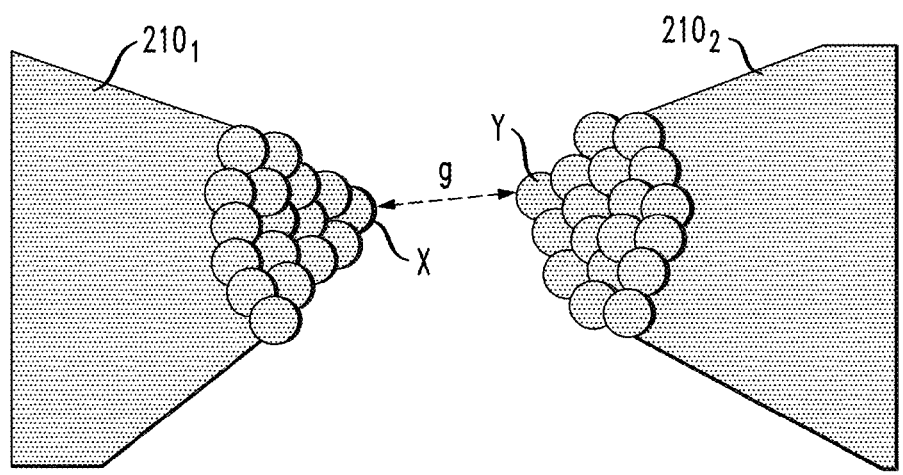

FIGS. 2D-2E illustrate a variation of the embodiment shown in FIG. 2A, in which an outer edge of each of trapezoid tapers $210_1$ and $210_2$ is not atomically smooth, straight, or linear. Such edges can be produced, e.g., by an electro-migration process as further explained below in reference to FIG. 12G. As indicated in FIG. 2D, gap 214 can have a fairly complex, irregular overall shape that causes the distance between tapers $210_1$ and $210_2$ (e.g., the width of gap 214) to vary along the length of the gap.

FIG. 2E shows a further enlarged view of a portion 216 (also see FIG. 2D) of gap 214 in which the distance between tapers $210_1$ and $210_2$ reaches its minimum. Example arrangement of the electrode parts in portion 216 can be analogous to that of two STM (scanning tunneling microscope) tips nearly touching each other. For some applications of device 100, it is expected that one or more pertinent device characteristics may be dominated by the atomic details of portion 216, such as the smallest distance g between tapers $210_1$ and $210_2$ and the chemical identity of the atoms X and Y located at the distance g.

A person of ordinary skill in the art will understand that FIGS. 2A-2E show only several example shapes of the tapers that can be used in constriction 114 and that various alternative geometric shapes can similarly be used therein.

Figure 3A:
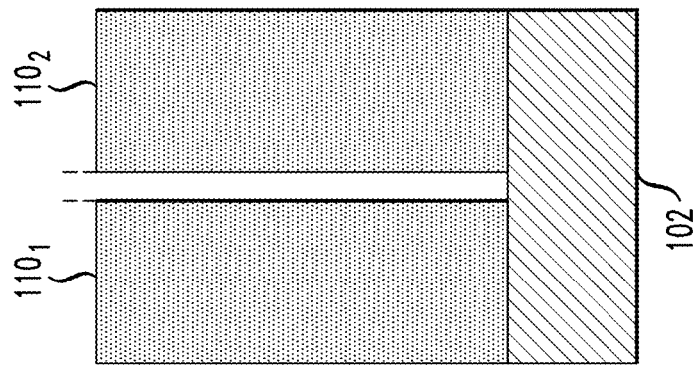
FIGS. 3A-3C show enlarged schematic side views of a constriction between two magnetic electrodes in the magnetic device of FIG. 1 according to example embodiments.
Figure 3B:
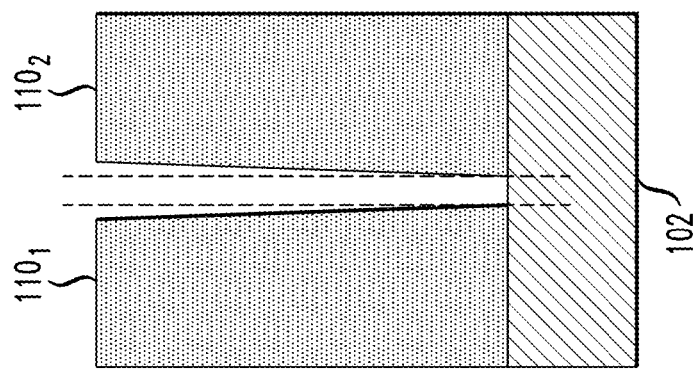
Figure 3C:
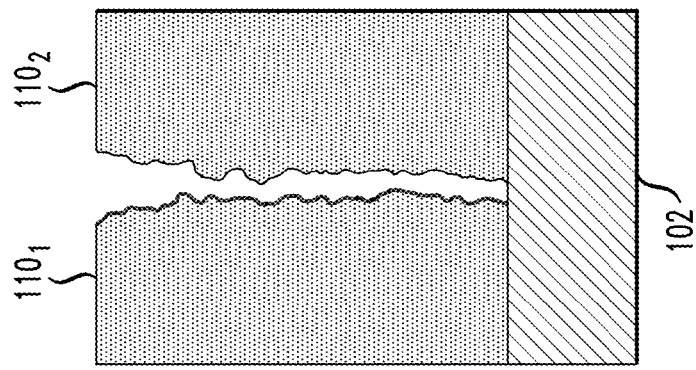

FIGS. 3A-3C show additional enlarged schematic views of constriction 114 between magnetic electrodes $110_1$ and $110_2$ in device 100 according to example embodiments. More specifically, the views shown in FIGS. 3A-3C are the side views of constriction 114 corresponding to FIG. 1B. FIG. 3A illustrates an embodiment in which the separation between magnetic electrodes $110_1$ and $110_2$ is uniform and does not depend on the distance from substrate 102. FIG. 3B illustrates an embodiment in which the separation between magnetic electrodes $110_1$ and $110_2$ linearly increases with an increase of the distance from substrate 102. FIG. 3C illustrates an example vertical profile of gap 214 in portion 216 illustrated in FIGS. 2D-2E.

Figure 4A:
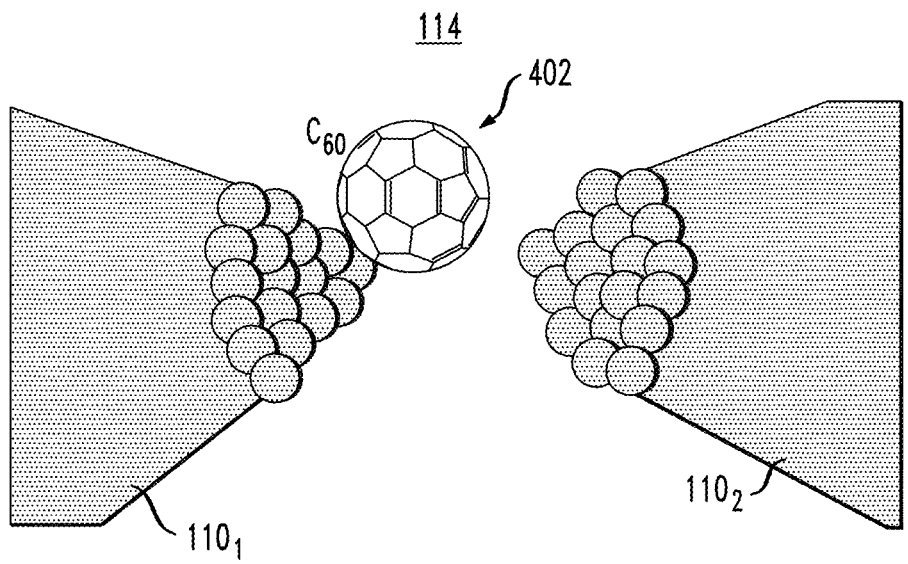
FIGS. 4A-4B illustrate alternative embodiments of the magnetic device of FIG. 1, each having a respective active element therein.
Figure 4B:
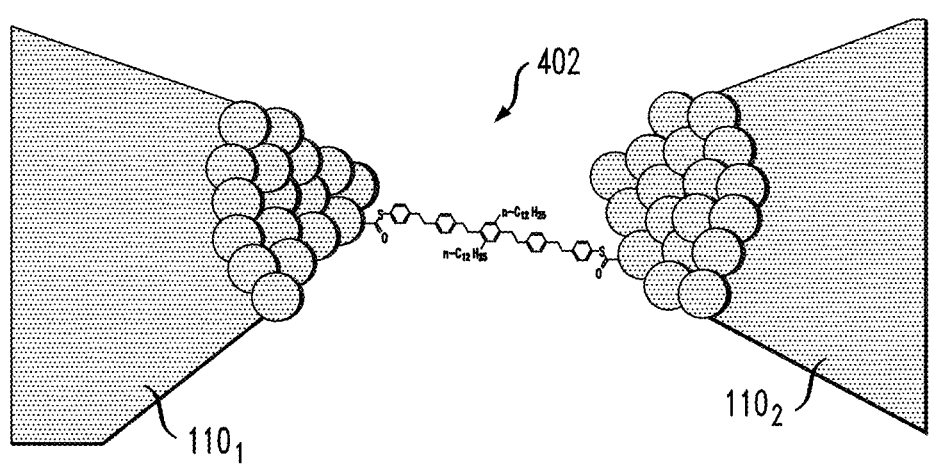

FIGS. 4A-4B illustrate alternative embodiments of device 100 in which an active element 402 is located within constriction 114. As used herein, the term "active element" refers to a nanometer-scale object intentionally placed in proximity to or inserted between the tapers of magnetic electrodes $110_1$ and $110_2$ (e.g., illustrated in FIGS. 2A-2E). In various embodiments, active element 402 may or may not be in direct physical contact with either or both of the tapers. In some embodiments, active element 402 may form one or more chemical bonds with either or both of the tapers of magnetic electrodes $110_1$ and $110_2$. In some embodiments, a voltage applied between electrodes $120_1$ and $120_2$ (see FIGS. 1A-1B) causes an electrical charge to flow through active element 402.

In the embodiment illustrated by FIG. 4A, active element 402 comprises a bucky-ball molecule, $C_{60}$. In the configuration shown in FIG. 4A, the bucky-ball molecule of active element 402 is in direct physical contact with magnetic electrode $110_1$, but not with magnetic electrode $110_2$. Other positions of the bucky-ball molecule with respect to magnetic electrodes $110_1$ and $110_2$ are also possible. In alternative embodiments, other fullerene molecules can be used to make active element 402.

In the embodiment illustrated by FIG. 4B, active element 402 comprises an organic molecule—a derivative of the thiol end-capped oligophenylenevinylene molecule (OPV-5) in which five benzene rings are connected through four double bonds. In addition to a delocalized π-electron system, this derivative of OPV-5 has (i) $n-C_{12}H_{25}$ side arms that make it soluble and (ii) acetyl protected thiol end groups that enable covalent bonding to metal electrodes, such as magnetic electrodes $110_1$ and $110_2$. In this particular embodiment, after the covalent bonding is achieved, the organic molecule of active element 402 is bonded to metal atoms by means of two —S(CO)— linkers, in each of which the sulfur is covalently bonded to an aromatic ring of OPV-5, and the carbon is covalently bonded to a metal atom of the corresponding magnetic electrode 110. In alternative embodiments, other organic molecules and/or chemical linkers can similarly be used. The linking chemical bonds can be covalent bonds, hydrogen bonds, or coordination bonds.

A person of ordinary skill in the art will understand that FIGS. 4A-4B show only two possible examples of active element 402 for device 100 and that other active elements can similarly be used therein. For example, alternative embodiments of active element 402 may include quantum dots, nanocrystals, biological and bioorganic molecules, polymers, metal-organic complexes, etc.

FIGS. 5A-5D show schematic top views of an array 500 of magnetic devices 100 (FIGS. 1A-1B) according to example embodiments. In each of the shown embodiments of array 500, magnetic devices 100 are fabricated on and share a common substrate 102 (also see FIGS. 1A-1B). The embodiment of array 500 shown in FIG. 5A includes fifteen arrayed magnetic devices 100. Each of the embodiments of array 500 shown in FIGS. 5B-5D includes sixteen arrayed magnetic devices 100. A person of ordinary skill in the art will understand that alternative embodiments of array 500 may include a different (from 15 or 16) number of arrayed magnetic devices 100.

Figure 5B:
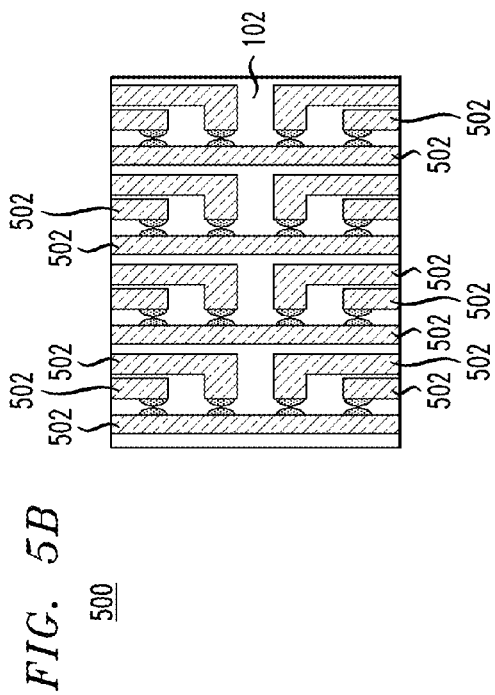
FIGS. 5A-5D show schematic top views of an array of the magnetic devices of FIG. 1 according to example embodiments.
Figure 5D:
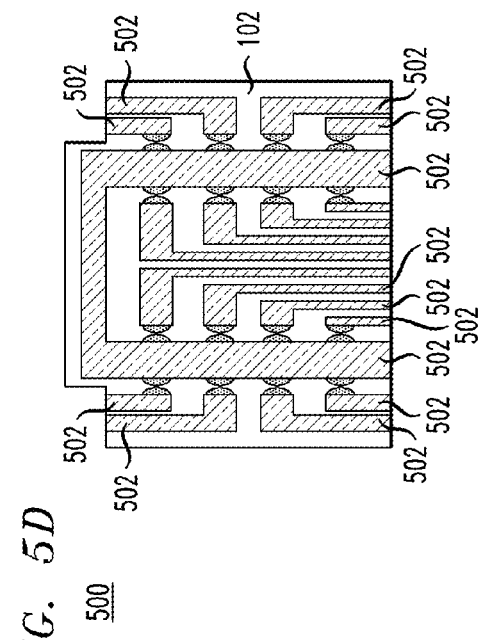
Figure 5A:
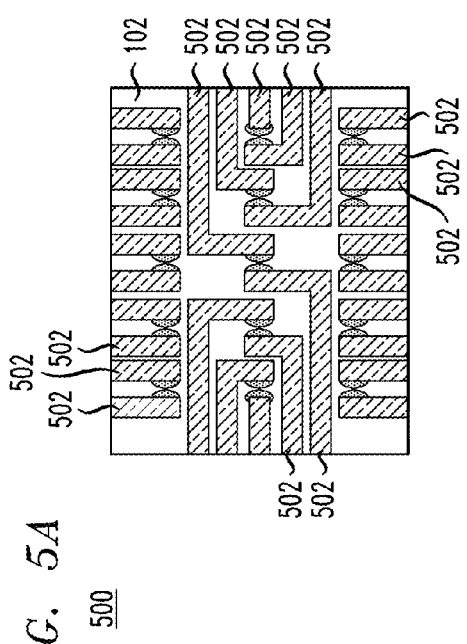

The embodiment of array 500 shown in FIG. 5A includes a plurality of electrically conducting tracks 502 arranged in a manner that makes each source electrode and each drain electrode of arrayed magnetic devices 100 individually addressable from the periphery of substrate 102.

In the embodiment of array 500 shown in FIG. 5B, magnetic devices 100 are arranged in a rectangular array having four rows and four columns. Electrically conducting tracks 502 are arranged in a manner that causes each column of magnetic devices 100 to share a respective common drain contact. However, each source electrode of arrayed magnetic devices 100 is still individually addressable from the periphery of substrate 102.

Figure 5C:
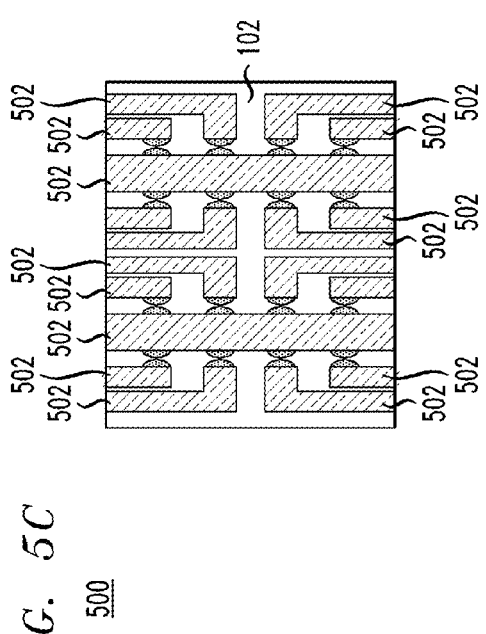

In the embodiment of array 500 shown in FIG. 5C, magnetic devices 100 are also arranged in a rectangular array having four rows and four columns. Electrically conducting tracks 502 are now arranged in a manner that causes each pair of columns of magnetic devices 100 to share a respective common drain contact. Each source electrode of arrayed magnetic devices 100 is still individually addressable from the periphery of substrate 102.

In the embodiment of array 500 shown in FIG. 5D, magnetic devices 100 are similarly arranged in a rectangular array having four rows and four columns. Electrically conducting tracks 502 are now arranged in a manner that causes all four columns of magnetic devices 100 to share a common drain contact. Each source electrode of arrayed magnetic devices 100 is still individually addressable from the periphery of substrate 102.

Figure 6:
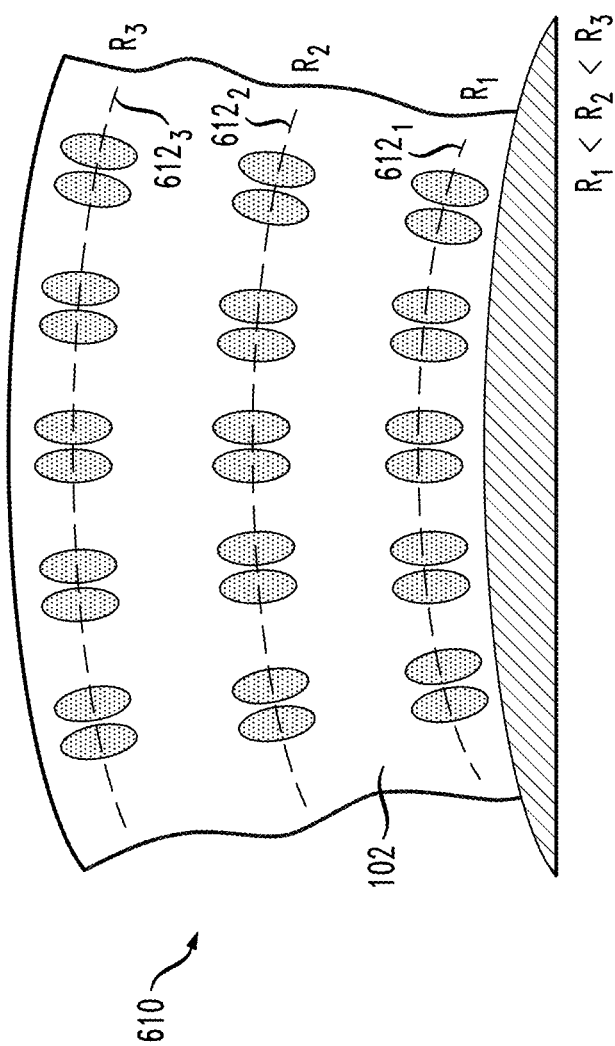
FIG. 6 shows a schematic top view of an array of magnetic devices of FIG. 1 according to an alternative embodiment.

FIG. 6 shows a schematic top view of an array 600 of magnetic devices 100 (FIGS. 1A-1B) according to an alternative embodiment. Similar to magnetic devices 100 of array 500, magnetic devices 100 of array 600 are fabricated on and share a common substrate 102. However, substrate 102 is now a part of a disk 610. Magnetic devices 100 are arranged on a surface of disk 610 along three circular tracks $612_i$ (i=1, 2, 3), each having a different respective radius $R_i$, e.g., as indicated in FIG. 6. In alternative embodiments, the number of circular tracks 612 may be different from three. Note that magnetic devices 100 used in array 600 do not have electrodes 120. Hence, conducting tracks similar to conducting tracks 502 (FIG. 5) are not necessary and not present in array 600. In some embodiments of array 600, magnetic electrodes $110_1$ and $110_2$ of individual magnetic devices 100 may not even have tapers analogous to those described above in reference to FIGS. 2A-2E.

Figure 7:
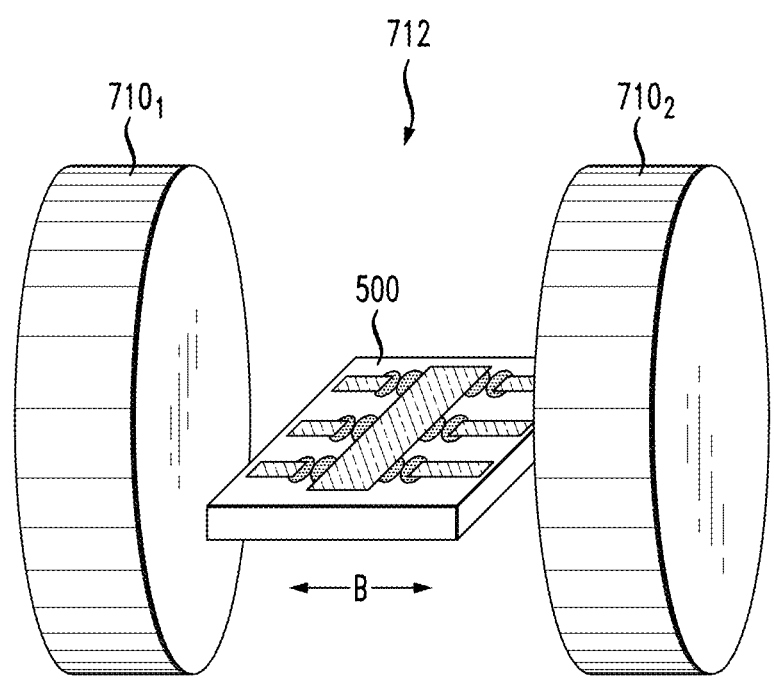
FIG. 7 pictorially illustrates a system in which an array of FIG. 5 can be used according to an embodiment.

FIG. 7 pictorially illustrates a system 700 in which array 500 (FIG. 5) can be used according to an embodiment. System 700 comprises a split-coil electromagnet having a cylindrical magnetic core 710. Array 500 is positioned within a relatively narrow gap 712 between two portions of magnetic core 710, which are labeled in FIG. 7 as $710_1$ and $710_2$, respectively. A magnetic field, B, can be generated within gap 712 by passing an electrical current through one or more coils (not explicitly shown in FIG. 7) wrapped around magnetic core 710. The resulting magnetic field B is directed generally parallel to the center axis of magnetic core 710, e.g., as indicated by the double-headed arrow B in FIG. 7. The direction of the magnetic field depends on the direction of the flow of the electrical current through the coil(s) and, as such, can be reversed by changing the electrical-current direction. The magnitude of the magnetic field depends on the magnitude of the electrical current and, as such, can be controllably changed by changing the latter. In an example embodiment, system 700 can be used to generate parallel and antiparallel alignment of remanent magnetization vectors in individual magnetic devices 100 of array 500, e.g., as described in more detail below in reference to FIG. 11.

Figure 8:
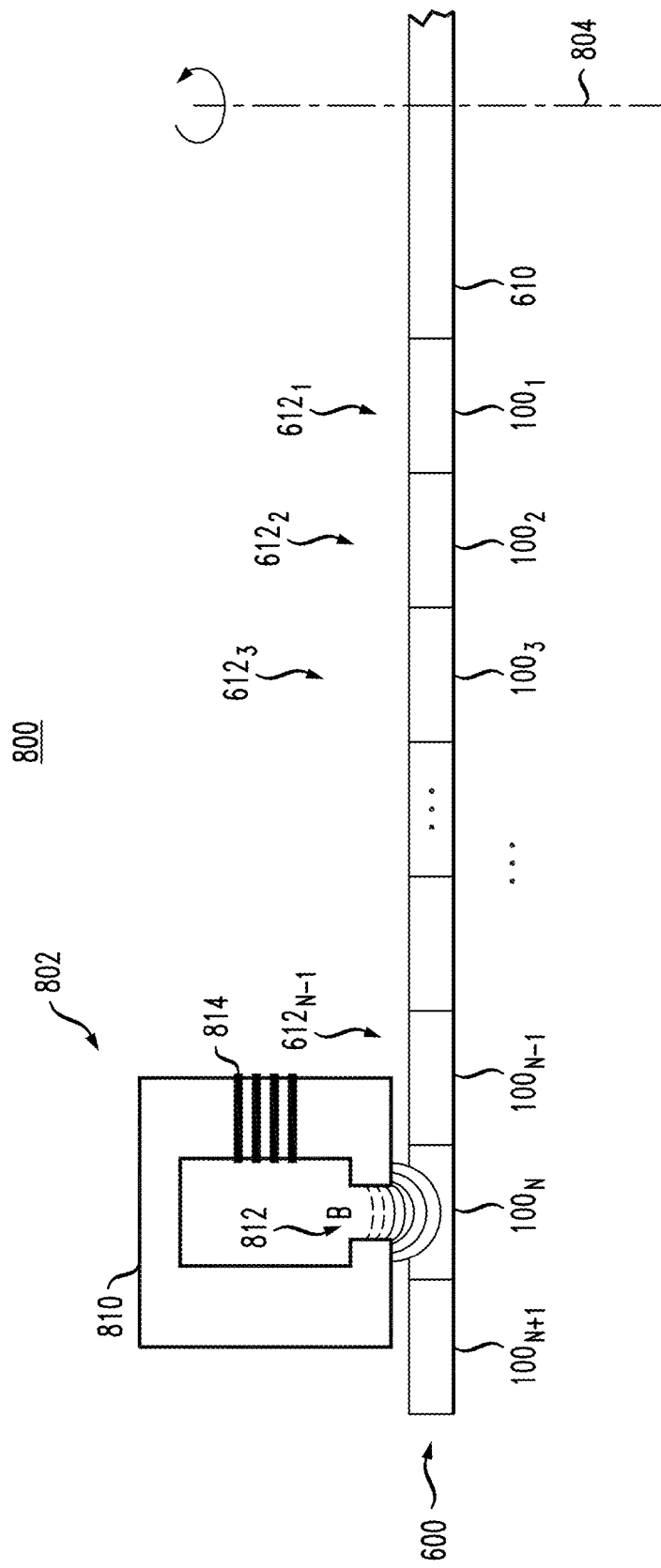
FIG. 8 shows a schematic diagram of a system in which the array of FIG. 6 can be used according to an embodiment.

FIG. 8 shows a schematic diagram of a system 800 in which array 600 (FIG. 6) can be used according to an embodiment. System 800 comprises an electromagnetic head 802 that is moveable along the radius of disk 610 in a manner that enables electromagnetic head to be positioned over any selected one of circular tracks 612 (also see FIG. 6). Disk 610 is rotatably mounted in system 800 such that it can be rotated about a rotation axis 804. This rotation enables electromagnetic head 802 to pass over any one of magnetic devices 100 of the selected circular track 612. In some embodiments, electromagnetic head 802 can operate as a read-write head. In alternative embodiments, electromagnetic head 802 can operate as a write head only, with a separate read head (not explicitly shown in FIG. 8) being used to read data written into array 600 using the shown write head. Each of magnetic devices 100 can be used to store one bit of information, e.g., such that parallel and antiparallel alignment of magnetization vectors in the magnetic device correspond to a binary "one" and a binary "zero," respectively.

In an example embodiment, electromagnetic head 802 comprises a C-shaped magnetic core 810 and a coil 814 of electrical wire wound about that core as indicated in FIG. 8. A gap 812 of core 810 is positioned to face disk 610 as further indicated in FIG. 8. A magnetic field, B, generated within and in proximity to gap 812 when an electrical current is passed through coil 814 can be used to alter the alignment of magnetization vectors in the magnetic device 100 located under the gap, e.g., as described in more detail below in reference to FIG. 11. In the disk/head configuration shown in FIG. 8, the magnetic device located under gap 812 is magnetic device $100_N$. As already indicated above, other magnetic devices 100 of array 600 can be brought to gap 812 by appropriately moving electromagnetic head 802 along the radius of disk 610 and rotating the disk about axis 804.

Figure 9A:
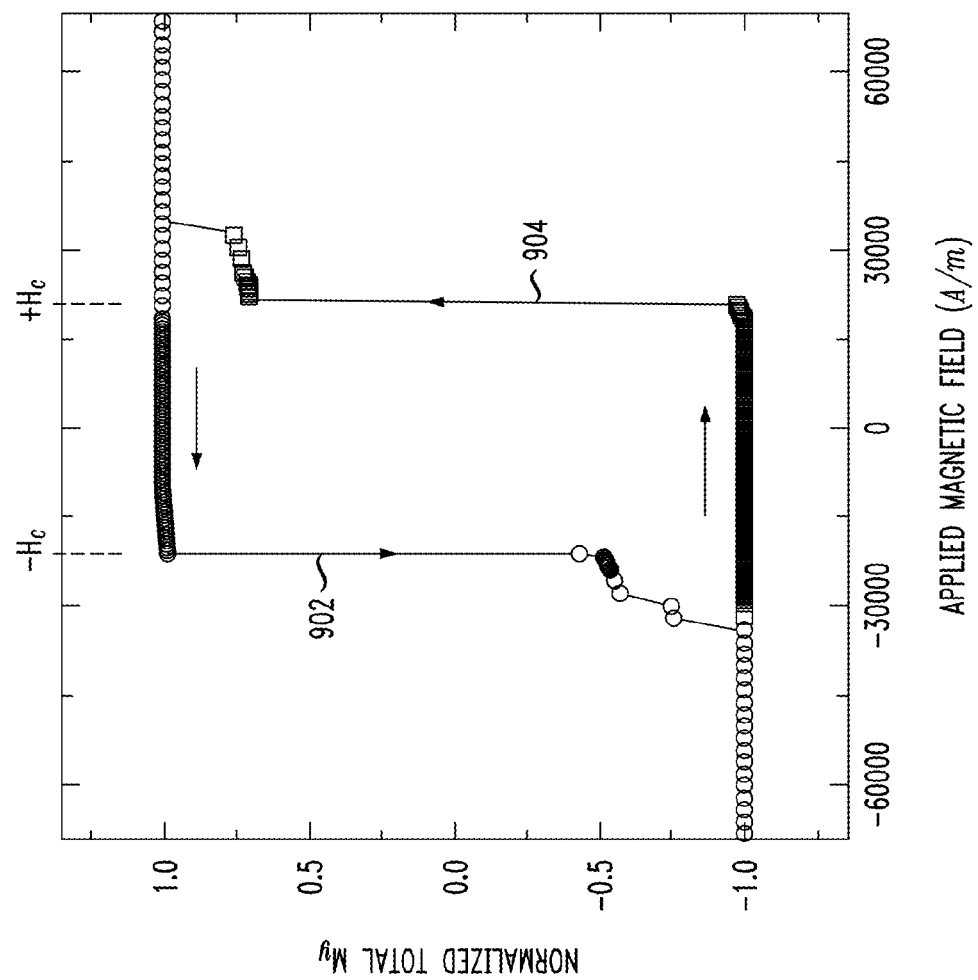

FIGS. 9A-9B graphically illustrate certain magnetic properties of magnetic device 100 (FIG. 1) according to an embodiment. More specifically, the data shown in FIG. 9 illustrate a hysteresis loop of normalized total transverse magnetization, $M_y$, that is produced in magnetic device 100 by exposure to an external magnetic field. The data of FIGS. 9A and 9B correspond to the external magnetic field being parallel to the y-axis and the x-axis, respectively. The data points in FIG. 9A were obtained using numerical simulations of the behavior of an embodiment of magnetic device 100 in which each of magnetic electrodes $110_1$ and $110_2$ is an ideal ellipse having the following characteristics: (i) the sizes of the major and minor axes are 400 nm and 200 nm, respectively; (ii) the electrode thickness is 15 nm; and (iii) the ferromagnetic material is permalloy. No tapers are present in constriction 114. The edge-to-edge separation d between magnetic electrodes $110_1$ and $110_2$ is 20 nm. The data points in FIG. 9B were obtained using numerical simulations of the behavior of an embodiment of magnetic device 100 that is the same as that used for FIG. 9A, except that constriction 114 had trapezoid tapers $210_1$ and $210_2$ therein, with the gap 214 between the trapezoid tapers being 3-nm wide (also see FIG. 2A).

The coordinate frame (xy) used in the numerical simulations is defined as follows. The x-axis is parallel to the line that connects the centers of the ellipses. The y-axis is parallel to the major axes of the ellipses. This coordinate frame is also shown for reference in FIGS. 10A, 11A, and 11E.

Referring to FIG. 9A, the external magnetic field is parallel to the y-axis. The arrows in FIG. 9A indicate the magnetic-field sweep direction. The positive saturation state ($M_y$=+1) is achieved by applying a relatively large (e.g., ~60000 A/m) positive magnetic field. As the magnetic field is swept in the negative direction, $M_y$ undergoes a step-like transition 902 at the negative critical field $-H_c$. Further increase of the (negative) magnitude of the external magnetic field, e.g., to −60000 A/m, causes $M_y$ to reach the negative saturation state ($M_y$=−1). Reversal of the sweep direction causes $M_y$ to undergo a step-like transition 904 at the positive critical field $+H_c$.

Referring to FIG. 9B, the external magnetic field is parallel to the x-axis. The arrows in FIG. 9B indicate the magnetic-field sweep direction. The positive saturation state ($M_y$=+1) is achieved by applying a relatively large (e.g., ~50000 A/m) positive magnetic field. As the magnetic field is swept in the negative direction, $M_y$ first exits the positive saturation state and decreases gradually and then undergoes a step-like transition 912 at the negative critical field $-H_c$. Further increase of the (negative) magnitude of the external magnetic field, e.g., to −50000 A/m, causes $M_y$ to more or less gradually reach the negative saturation state ($M_y$=−1). Reversal of the sweep direction causes $M_y$ to go through similar changes, but with a corresponding step-like transition 914 now occurring at the positive critical field $+H_c$.

Figure 10A:
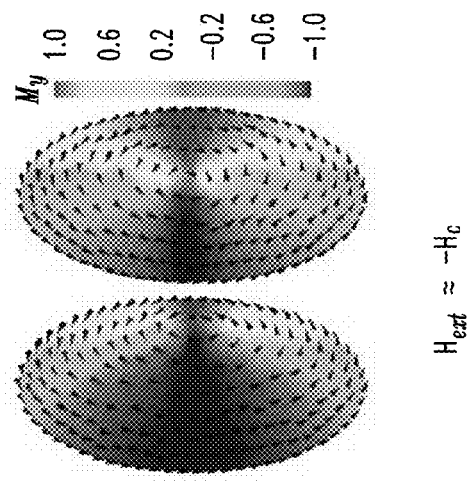
FIGS. 10A-10C illustrate magnetization distributions in the magnetic device of FIG. 1 according to an embodiment.
Figure 10B:
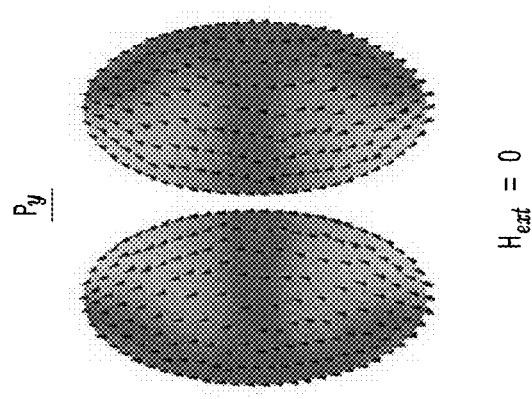
Figure 10C:
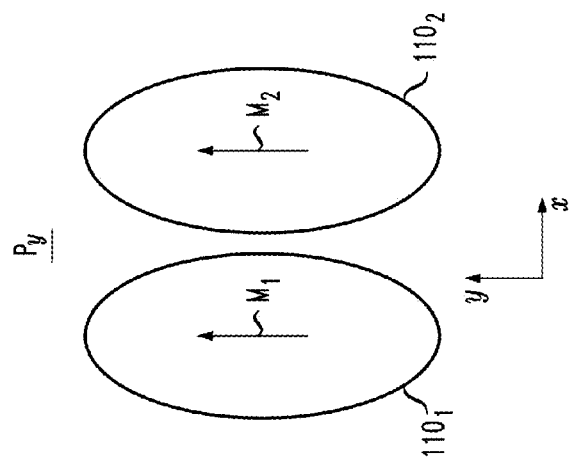

FIGS. 10A-10C illustrate magnetization distributions in magnetic device 100 according to an embodiment. More specifically, the shown magnetization distributions are obtained using the numerical simulations described above in reference to FIG. 9A. FIG. 10A schematically shows a parallel magnetization state $P_y$ of magnetic device 100. FIGS. 10B-10C show maps of two example magnetization distributions in magnetic device 100 at different respective strengths of the external magnetic field.

FIG. 10A shows individual total magnetization vectors $M_1$ and $M_2$ of magnetic electrodes $110_1$ and $110_2$ in the parallel magnetization state $P_y$. Also shown is the above-mentioned xy coordinate frame. Because each of magnetization vectors $M_1$ and $M_2$ is parallel to the y-axis, and both vectors are pointing in the same positive y direction, the corresponding magnetization state of magnetic device 100 is denoted as a parallel magnetization state.

FIG. 10B shows the map of the magnetization distribution corresponding to the parallel magnetization state $P_y$ of FIG. 10A at remanence. The map is color-coded using the color bar shown in FIG. 10C. The small black cones indicate the local magnetization directions. The magnetization distribution of FIG. 10B can be generated, e.g., by (i) applying the external magnetic field ($H_{ext}$) of about +60000 A/m and (ii) ramping down the external magnetic field to $H_{ext}$=0 (also see FIG. 9). In an example embodiment, the external magnetic field can be generated and changed as appropriate or necessary using system 700 (FIG. 7).

FIG. 10C shows the map of the magnetization distribution that can be obtained in magnetic device 100 by further sweeping the external magnetic field from $H_{ext}$=0 (FIG. 10B) to a negative value that is just past the negative critical field $-H_c$ (also see FIG. 9). In this state, $M_y$ has just undergone the transition 902, and each of magnetic electrodes $110_1$ and $110_2$ exhibits a respective single-vortex magnetization distribution, as is evident from inspection of the shown color-coded map. An anti-parallel magnetization state is not achieved here because very similar magnetization distributions are produced in both magnetic electrodes $110_1$ and $110_2$.

Figure 11C:
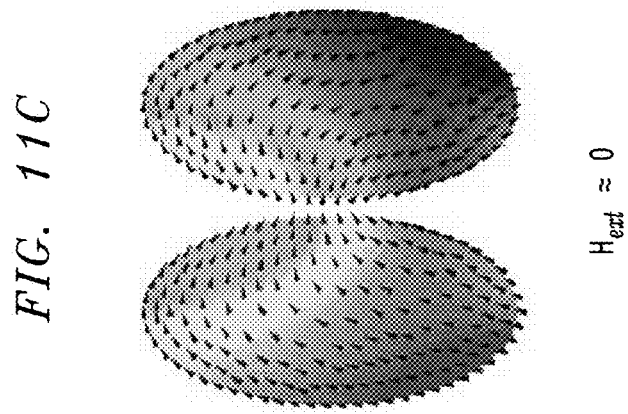
FIGS. 11A-11E illustrate magnetization distributions in the magnetic device of FIG. 1 according to an alternative embodiment.
Figure 11B:
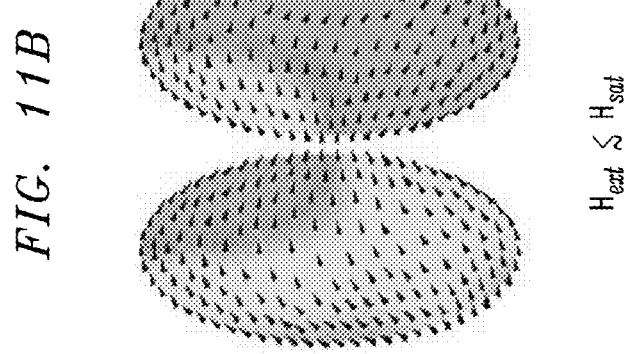
Figure 11A:
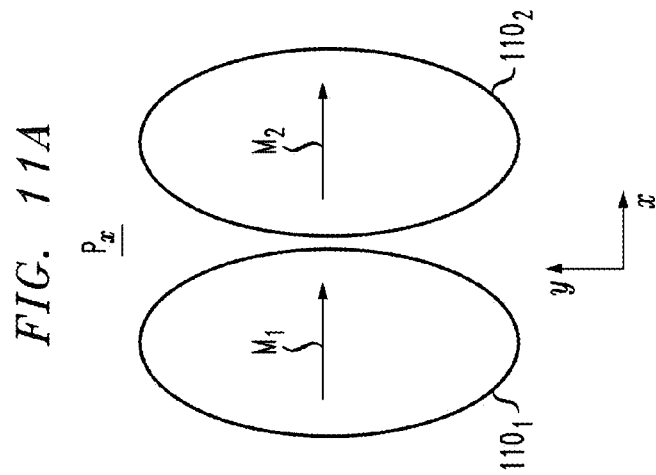
Figure 11E:
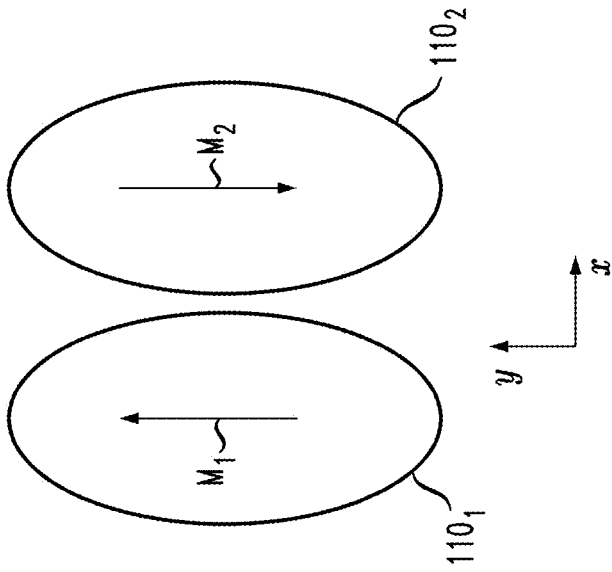
Figure 11D:
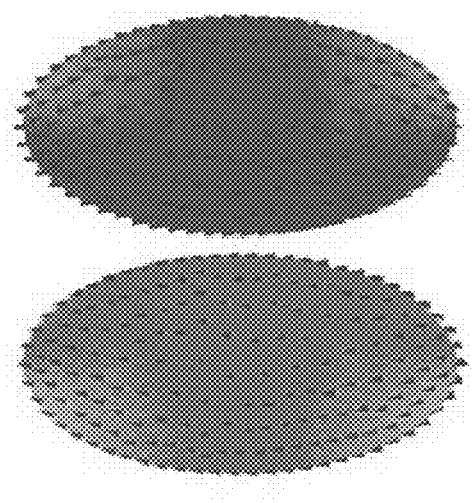

FIGS. 11A-11E illustrate magnetization distributions in magnetic device 100 according to an alternative embodiment. More specifically, the shown magnetization distributions are obtained using the numerical simulations that are analogous to those described above in reference to FIG. 9B, with the difference being that constriction 114 did not have trapezoid tapers $210_1$ and $210_2$ therein. FIG. 11A schematically shows a parallel magnetization state $P_x$ of magnetic device 100. FIG. 11E similarly shows an antiparallel magnetization state $AP_y$ of magnetic device 100. FIGS. 11B-11D show maps of three example magnetization distributions in magnetic device 100 at different respective strengths of the external magnetic field. The maps shown in FIGS. 11B-11D are color-coded using the same color bar as the color bar shown in FIG. 10C. The small black cones in FIGS. 11B-11D indicate the local magnetization directions.

FIG. 11A shows individual total magnetization vectors $M_1$ and $M_2$ of magnetic electrodes $110_1$ and $110_2$ in the parallel magnetization state $P_x$. Also shown is the corresponding xy coordinate frame. Because each of magnetization vectors $M_1$ and $M_2$ is parallel to the x-axis, and both vectors are pointing in the same positive x direction, the corresponding magnetization state of magnetic device 100 is denoted as a parallel magnetization state. The parallel magnetization state $P_x$ of FIG. 11A can be generated, e.g., by applying a positive saturating external magnetic field, $H_{sat}$, that is parallel to the x-axis.

FIGS. 11B and 11C show the maps of the magnetization distributions that can be obtained in magnetic device 100 by sweeping the external magnetic field from $H_{ext}=H_{sat}$ (FIG. 11A) to a positive value that is slightly smaller than $H_{sat}$ (FIG. 11B) and then further to a positive value that is slightly higher than $H_{ext}=0$. Comparison of the maps shown in FIGS. 11B and 11C reveals that the changing external magnetic field causes the local magnetization vectors in magnetic electrodes $110_1$ and $110_2$ to rotate in mostly opposite directions. More specifically, the local magnetization vectors in magnetic electrode $110_1$ mostly rotate counterclockwise, while the local magnetization vectors in magnetic electrode $110_2$ mostly rotate clockwise.

FIG. 11D shows the map of the magnetization distribution that can be obtained in magnetic device 100 by further sweeping the external magnetic field from that of FIG. 11C to a negative value that is just past the negative critical field $-H_c$. In this state, $M_y$ has just undergone the transition that is analogous to transition 912 (see FIG. 9B). The resulting magnetization state is an anti-parallel magnetization state $AP_y$ because the local magnetization vectors in magnetic electrode $110_1$ mostly point in the positive y direction while the local magnetization vectors in magnetic electrode $110_2$ mostly point in the negative y direction.

FIG. 11E shows individual total magnetization vectors $M_1$ and $M_2$ of magnetic electrodes $110_1$ and $110_2$ in the antiparallel magnetization state $AP_y$. Also shown is the corresponding xy coordinate frame. Each of magnetization vectors $M_1$ and $M_2$ is parallel to the y-axis, and the two vectors are pointing in opposite directions, which causes the corresponding magnetization state of magnetic device 100 to be an antiparallel magnetization state.

In an example embodiment, the external magnetic field needed to implement the magnetization changes indicated in FIGS. 11A-11E can be generated using system 700 (FIG. 7) or system 800 (FIG. 8). In the latter case, the parallel magnetization state $P_x$ of FIG. 11A can be used to store a binary "one" in the corresponding magnetic device 100. The antiparallel magnetization state $AP_y$ of FIG. 11E can similarly be used to store a binary "zero" in the corresponding magnetic device 100. The stored bit value can be changed by subjecting the corresponding magnetic device 100 to an appropriate external magnetic field, e.g., as explained above in reference to FIGS. 11A-11E.

FIGS. 12A-12G illustrate a fabrication method that can be used to make magnetic device 100 according to an embodiment. More specifically, each of FIGS. 12A-12G shows a side view of the nascent magnetic device 100 during a respective fabrication step. The views of FIGS. 12A-12G are generally analogous to the view shown in FIG. 1B.

Referring to FIG. 12A, substrate 102 is coated with a layer 1202 of an e-beam resist. Electron-beam lithography (EBL) is then used to expose and develop layer 1202 to create an opening 1204 therein in the general shape intended for magnetic electrodes $110_1$ and $110_2$. A layer 1206 of a suitable ferromagnetic material (e.g., permalloy) is then deposited over the developed layer 1202 and into opening 1204.

Referring to FIG. 12B, layer 1202 and the portions of layer 1206 that are not in direct contact with substrate 102 are removed using a conventional solvent lift-off process involving immersion into a solvent (e.g., acetone) bath. The surface of a remaining portion $1206_r$ of layer 1206 may get oxidized over time to produce thereon a relatively thin layer 1212 of the corresponding native metal oxide.

Referring to FIG. 12C, the structure produced after the fabrication steps of FIG. 12B is coated with a layer 1214 of an e-beam resist.

Referring to FIG. 12D, EBL is used to expose and develop layer 1214 to create openings $1216_1$ and $1216_2$ therein in the general shape intended for non-magnetic electrodes $120_1$ and $120_2$, respectively. Portions of metal-oxide layer 1212 exposed by openings $1216_1$ and $1216_2$ are etched off. The latter can be done using wet or dry methods, e.g., a dry plasma etch or a wet chemical etch.

Referring to FIG. 12E, a layer 1218 of a suitable non-magnetic metal (e.g., Au, Ti) is deposited over the developed layer 1214 and into openings $1216_1$ and $1216_2$.

Referring to FIG. 12F, layer 1214 is removed by immersion into the solvent bath mentioned above. The removal of layer 1214 also causes a removal of the portions of layer 1218 that are not in direct contact with substrate 102 and/or portion $1206_r$. The remaining portions of layer 1218 form electrodes $120_1$ and $120_2$.

Referring to FIG. 12G, a suitable bias voltage, $V_b$, is applied to electrodes $120_1$ and $120_2$ to induce an electro-migration process in portion $1206_r$. The electro-migration process creates gap 214 (also see FIG. 2D), thereby splitting portion $1206_r$ and the remaining portion of metal-oxide layer 1212 to produce magnetic electrodes $110_1$ and $110_2$ and separated layers 112 (also see FIG. 1B). The bias voltage $V_b$ is removed to arrive at the final structure of magnetic device 100 (also see FIGS. 1A-1B).

In alternative embodiments, a nanometer-sized gap 214 between magnetic electrodes $110_1$ and $110_2$ can be created, e.g., as described in the following publications: (i) J. Tang, E. P. De Poortere, J. E. Klare, C. Nuckolls, and S. J. Wind, "Single-molecule transistor fabrication by self-aligned lithography and in situ molecular assembly" Microelectronic Engineering, 83, 1706-1709 (2006); (ii) A. Fursina, S. Lee, R. G. S. Sofin, I. V. Shvets, and D. Natelson "Nanogaps with very large aspect ratios for electrical measurements" Applied Physics Letters, 92, 113102 (2008); (iii) D. Ward, "Electrical and optical characterization of molecular nanojunctions" Thesis, Rice University (2010). Each of these publications is incorporated herein by reference in its entirety.

According to an example embodiment disclosed above in reference to FIGS. 1-12, provided is an apparatus comprising: a substrate (e.g., 102, FIG. 1); and a first set of electrodes supported on the substrate, the set including a first thin-film magnetic electrode (e.g., $110_1$, FIG. 1) and a second thin-film magnetic electrode (e.g., $110_2$, FIG. 1), each of the first and second thin-film magnetic electrodes having a substantially oval shape. The substantially oval shape is characterized by a first axis having a first size and a second axis having a second size, the first and second axes being orthogonal to one another, and the second size being larger than the first size. The first axis of the first thin-film magnetic electrode and the first axis of the second thin-film magnetic electrode are collinear, and an edge-to-edge separation between the first thin-film magnetic electrode and the second thin-film magnetic electrode is smaller than the first size.

In some embodiments of the above apparatus, each of the first and second thin-film magnetic electrodes comprises a ferromagnetic material.

In some embodiments of any of the above apparatus, the substrate comprises one or more of silicon and silicon oxide.

In some embodiments of any of the above apparatus, each of the first and second thin-film magnetic electrodes includes a respective taper (e.g., $210_i/220_i/230_i$, FIG. 2) that extends from a respective electrode edge in a constriction area (e.g., 114, FIG. 1) between the first and second thin-film magnetic electrodes.

In some embodiments of any of the above apparatus, a gap (e.g., 214, FIG. 2) between the respective tapers has a width that is smaller than the edge-to-edge separation.

In some embodiments of any of the above apparatus, the width of the gap varies along a length of the gap (e.g., as shown in FIG. 2B or 2D).

In some embodiments of any of the above apparatus, the width of the gap varies as a function of a distance from the substrate (e.g., as shown in FIG. 3B or 3C).

In some embodiments of any of the above apparatus, the apparatus further comprises an active element (e.g., 402, FIG. 4) at least a portion of which is located in the gap between the respective tapers.

In some embodiments of any of the above apparatus, the active element is one or more of a quantum dot, a nanocrystal, a single molecule, a polymer, and a metal-organic complex.

In some embodiments of any of the above apparatus, the active element comprises a fullerene molecule (e.g., $C_{60}$, FIG. 4A).

In some embodiments of any of the above apparatus, the active element comprises one or more linkers, each of which is chemically bonded to a respective metal atom of the respective taper (e.g., as shown in FIG. 4B).

In some embodiments of any of the above apparatus, the respective tapers are connected to one another to form a magnetic bridge between the first and second thin-film magnetic electrodes (e.g., as indicated in FIG. 12F).

In some embodiments of any of the above apparatus, the apparatus further comprises a plurality of additional sets of electrodes, each of the additional sets of electrodes being a nominal copy of the first set of electrodes, wherein the first set of electrodes and the plurality of additional sets of electrodes are arranged in an array (e.g., 500, FIG. 5; 600, FIG. 6) on the substrate.

In some embodiments of any of the above apparatus, the apparatus further comprises a disk (e.g., 610, FIG. 6), wherein the substrate is a part of the disk; and wherein the first set of electrodes and the plurality of additional sets of electrodes are arranged along one or more circular tracks (e.g., 612, FIG. 6 or 8) on the disk.

In some embodiments of any of the above apparatus, the first set of electrodes further includes: a first non-magnetic metal electrode (e.g., $120_1$, FIG. 1) attached to the first thin-film magnetic electrode; and a second non-magnetic metal electrode (e.g., $120_2$, FIG. 1) attached to the second thin-film magnetic electrode; and the apparatus further comprises a plurality of electrically conducting tracks (e.g., 502, FIG. 5) connected to the first and second non-magnetic metal electrodes of the first set of electrodes and of the plurality of additional sets of electrodes.

In some embodiments of any of the above apparatus, the array comprises two or more rows and two or more columns of the sets of electrodes (e.g., as shown in FIG. 5); and the plurality of electrically conducting tracks are arranged in a manner that makes each of the first thin-film magnetic electrodes individually addressable from the periphery of the substrate (e.g., as shown in FIG. 5).

In some embodiments of any of the above apparatus, the plurality of electrically conducting tracks are further arranged in a manner that makes each of the second thin-film magnetic electrodes individually addressable from the periphery of the substrate (e.g., as shown in FIG. 5A).

In some embodiments of any of the above apparatus, the plurality of electrically conducting tracks are further arranged in a manner that makes the second thin-film magnetic electrodes in a column to be connected to a corresponding one of the electrically conducting tracks (e.g., as shown in FIG. 5B or FIG. 5C or FIG. 5D).

In some embodiments of any of the above apparatus, the first set of electrodes further includes: a first non-magnetic metal electrode (e.g., $120_1$, FIG. 1) attached to the first thin-film magnetic electrode; and a second non-magnetic metal electrode (e.g., $120_2$, FIG. 1) attached to the second thin-film magnetic electrode.

In some embodiments of any of the above apparatus, each of the first and second non-magnetic metal electrodes includes one or both of gold and titanium.

In some embodiments of any of the above apparatus, the apparatus further comprises means (e.g., 710, FIG. 7; 802, FIG. 8) for subjecting the first set of electrodes to an external magnetic field.

In some embodiments of any of the above apparatus, the means for subjecting causes the external magnetic field to have a component that is parallel to the first axes (e.g., B, FIG. 7).

In some embodiments of any of the above apparatus, the substantially oval shape is a substantially ellipse shape.

In some embodiments of any of the above apparatus, each of the first thin-film magnetic electrode and the second thin-film magnetic electrode has a thickness that is smaller than the first size.

In some embodiments of any of the above apparatus, the thickness is smaller than the edge-to-edge separation.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

What is claimed is:

1. An apparatus comprising:
a substrate; and
a first set of electrodes supported on the substrate, the first set including a first thin-film magnetic electrode and a second thin-film magnetic electrode, each of the first and second thin-film magnetic electrodes having a substantially oval shape;
wherein the substantially oval shape is characterized by a first axis having a first size and a second axis having a second size, the first and second axes being orthogonal to one another, and the second size being larger than the first size;
wherein the first axis of the first thin-film magnetic electrode and the first axis of the second thin-film magnetic electrode are collinear;
wherein a distance between the second axis of the first thin-film magnetic electrode and the second axis of the second thin-film magnetic electrode is greater than the first size; and
wherein an edge-to-edge separation between the first thin-film magnetic electrode and the second thin-film magnetic electrode is smaller than the first size.

2. The apparatus of claim 1, wherein each of the first and second thin-film magnetic electrodes includes a respective taper that extends from a respective electrode edge in a constriction area between the first and second thin-film magnetic electrodes.

3. The apparatus of claim 2, wherein a gap between the respective tapers has a width that is smaller than the edge-to-edge separation.

4. The apparatus of claim 3, wherein the width of the gap varies along a length of the gap.

5. The apparatus of claim 3, wherein the width of the gap varies as a function of a distance from the substrate.

6. The apparatus of claim 3, further comprising an active element at least a portion of which is located in the gap between the respective tapers.

7. The apparatus of claim 6, wherein the active element is one or more of a quantum dot, a nanocrystal, a single molecule, a polymer, and a metal-organic complex.

8. The apparatus of claim 6, wherein the active element comprises a fullerene molecule.

9. The apparatus of claim 6, wherein the active element comprises one or more linkers, each of which is chemically bonded to a respective metal atom of the respective taper.

10. The apparatus of claim 2, wherein the respective tapers are connected to one another to form a magnetic bridge between the first and second thin-film magnetic electrodes.

11. The apparatus of claim 1, further comprising a plurality of additional sets of electrodes, each of the additional sets of electrodes being a nominal copy of the first set of electrodes, wherein the first set of electrodes and the plurality of additional sets of electrodes are arranged in an array on the substrate.

12. The apparatus of claim 1, wherein the first set of electrodes further includes:
a first non-magnetic metal electrode attached to the first thin-film magnetic electrode; and
a second non-magnetic metal electrode attached to the second thin-film magnetic electrode.

13. The apparatus of claim 1, wherein each of the first thin-film magnetic electrode and the second thin-film magnetic electrode has a thickness that is smaller than the first size.

14. An apparatus comprising:
a substrate; and
a first set of electrodes supported on the substrate, the first set including a first thin-film magnetic electrode and a second thin-film magnetic electrode, each of the first and second thin-film magnetic electrodes having a substantially oval shape;
wherein the substantially oval shape is characterized by a first axis having a first size and a second axis having a second size, the first and second axes being orthogonal to one another, and the second size being larger than the first size;
wherein the first axis of the first thin-film magnetic electrode and the first axis of the second thin-film magnetic electrode are collinear;
wherein an edge-to-edge separation between the first thin-film magnetic electrode and the second thin-film magnetic electrode is smaller than the first size; and
wherein each of the first and second thin-film magnetic electrodes includes a respective taper that extends from a respective electrode edge in a constriction area between the first and second thin-film magnetic electrodes.

15. The apparatus of claim 14, wherein a gap between the respective tapers has a width that is smaller than the edge-to-edge separation.

16. The apparatus of claim 15, wherein the width of the gap varies along a length of the gap.

17. The apparatus of claim 15, further comprising an active element at least a portion of which is located in the gap between the respective tapers.

18. The apparatus of claim 17, wherein the active element is one or more of a quantum dot, a nanocrystal, a single molecule, a polymer, and a metal-organic complex.

19. The apparatus of claim 17, wherein the active element comprises a fullerene molecule.

20. The apparatus of claim 17, wherein the active element comprises one or more linkers, each of which is chemically bonded to a respective metal atom of the respective taper.

21. An apparatus comprising:
a substrate; and
a first set of electrodes supported on the substrate, the first set including a first thin-film magnetic electrode and a second thin-film magnetic electrode, each of the first and second thin-film magnetic electrodes having a substantially oval shape;
wherein the substantially oval shape is characterized by a first axis having a first size and a second axis having a second size, the first and second axes being orthogonal to one another, and the second size being larger than the first size;
wherein the first axis of the first thin-film magnetic electrode and the first axis of the second thin-film magnetic electrode are collinear;
wherein an edge-to-edge separation between the first thin-film magnetic electrode and the second thin-film magnetic electrode is smaller than the first size; and
wherein the first set of electrodes further includes:
a first non-magnetic metal electrode attached to the first thin-film magnetic electrode; and
a second non-magnetic metal electrode attached to the second thin-film magnetic electrode.

* * * * *